(12) United States Patent
Kume et al.

(10) Patent No.: US 9,267,059 B2
(45) Date of Patent: Feb. 23, 2016

(54) ADHESIVE SHEET AND METHOD OF BACKGRINDING SEMICONDUCTOR WAFER

(75) Inventors: Masashi Kume, Shibukawa (JP); Tomomichi Takatsu, Shibukawa (JP)

(73) Assignee: DENKA COMPANY LIMITED, Tokyo (JP)

( * ) Notice: Subject to any disclaimer, the term of this patent is extended or adjusted under 35 U.S.C. 154(b) by 805 days.

(21) Appl. No.: 13/318,436

(22) PCT Filed: May 31, 2010

(86) PCT No.: PCT/JP2010/059210
§ 371 (c)(1),
(2), (4) Date: Nov. 1, 2011

(87) PCT Pub. No.: WO2010/140569
PCT Pub. Date: Dec. 9, 2010

(65) Prior Publication Data
US 2012/0052772 A1    Mar. 1, 2012

(30) Foreign Application Priority Data

Jun. 5, 2009  (JP) ................................ 2009-135758

(51) Int. Cl.
| | | |
|---|---|---|
| C09J 7/00 | (2006.01) | |
| B24B 37/04 | (2012.01) | |
| C09J 7/02 | (2006.01) | |
| C09J 133/06 | (2006.01) | |
| H01L 21/683 | (2006.01) | |
| C08K 5/54 | (2006.01) | |
| C08L 83/00 | (2006.01) | |
| C08K 5/00 | (2006.01) | |
| C08F 220/18 | (2006.01) | |

(52) U.S. Cl.
CPC .............. *C09J 7/0246* (2013.01); *C09J 133/06* (2013.01); *H01L 21/6836* (2013.01); *C08F 2220/1825* (2013.01); *C08K 5/0025* (2013.01); *C08K 5/54* (2013.01); *C08L 83/00* (2013.01); *C09J 2203/326* (2013.01); *C09J 2205/102* (2013.01); *C09J 2423/04* (2013.01); *C09J 2431/00* (2013.01); *C09J 2433/00* (2013.01); *H01L 2221/68327* (2013.01); *Y10T 428/287* (2015.01); *Y10T 428/2891* (2015.01)

(58) Field of Classification Search
CPC .......... B24B 37/04; B24B 37/042; C09J 7/00; C09J 7/0246
USPC ............... 451/41, 54, 285, 287; 428/343–349
See application file for complete search history.

(56) References Cited

U.S. PATENT DOCUMENTS

| | | | | |
|---|---|---|---|---|
| 5,091,483 | A | * | 2/1992 | Mazurek et al. .............. 525/477 |
| 5,314,748 | A | * | 5/1994 | Mazurek et al. .............. 428/345 |
| 5,475,124 | A | * | 12/1995 | Mazurek et al. .............. 556/419 |
| 6,565,969 | B1 | * | 5/2003 | Lamon et al. ................. 428/349 |
| 6,623,594 | B1 | | 9/2003 | Yamamoto et al. |
| 7,833,577 | B2 | * | 11/2010 | Sheridan et al. ........... 427/207.1 |
| 8,334,037 | B2 | * | 12/2012 | Sheridan et al. ............. 428/40.7 |
| 2005/0203250 | A1 | | 9/2005 | Miyakawa et al. |
| 2008/0280037 | A1 | * | 11/2008 | Sheridan et al. ........... 427/208.8 |
| 2008/0280086 | A1 | * | 11/2008 | Sheridan et al. ............. 428/40.7 |
| 2011/0284159 | A1 | * | 11/2011 | Tanaka et al. ................. 156/329 |
| 2013/0075027 | A1 | * | 3/2013 | Sheridan et al. .............. 156/249 |

FOREIGN PATENT DOCUMENTS

| | | |
|---|---|---|
| CN | 101118842 A | 2/2008 |
| CN | 101376797 A | 5/2011 |
| JP | 04-117475 | 4/1992 |
| JP | 07-331210 | 12/1995 |
| JP | 10-189504 | 7/1998 |
| JP | 2000-008010 | 1/2000 |
| JP | 2000-038556 | 2/2000 |
| JP | 2000-212520 | 8/2000 |
| JP | 2004-006746 | 1/2004 |
| JP | 2005-033000 | 2/2005 |
| JP | 2008-311514 | 12/2008 |

OTHER PUBLICATIONS

International Search Report issued in International Application No. PCT/JP2010/059210 on Aug. 31, 2010.
Office Action issued by SIPO on Feb. 7, 2013, in corresponding Chinese Patent Application No. 2013081400922140.

* cited by examiner

*Primary Examiner* — Eileen Morgan
(74) *Attorney, Agent, or Firm* — Stein IP, LLC

(57) ABSTRACT

After an adhesive sheet is pasted on a semiconductor wafer, an adhesive of the sheet increases tight attachment to the semiconductor wafer because wetting spreads over time. Due to this, at the time of peeling the adhesive sheet from the ground semiconductor wafer, the semiconductor wafer used to be damaged. This phenomenon is likely to occur for a thinner semiconductor wafer. The present invention resides in an adhesive sheet including a substrate and an adhesive layer disposed on the substrate. The substrate is formed of an ethylene/vinyl acetate copolymer having a vinyl acetate content of 10% by mass or less. The adhesive layer contains 100 parts by mass of a (meth)acrylate ester copolymer, 1 to 10 parts by mass of a cross-linker, 0.05 to 5 parts by mass of a silicone compound. The (meth)acrylate ester copolymer is formed of a copolymer produced by polymerizing a (meth)acrylate ester monomer and a functional-group-containing monomer.

4 Claims, No Drawings

ADHESIVE SHEET AND METHOD OF BACKGRINDING SEMICONDUCTOR WAFER

CROSS-REFERENCE TO RELATED APPLICATIONS

This application is a national phase of PCT International Patent Application No. PCT/JP2010/059210, filed May 31, 2010, and Japanese Patent Application No. 2009-135758, filed Jun. 5, 2009, in the Japanese Patent Office, the disclosures of which are incorporated herein by reference.

BACKGROUND OF THE INVENTION

1. Field of the Invention

The present invention relates to adhesive sheets and methods of grinding a semiconductor wafer by using the adhesive sheet.

2. Description of the Related Art

Patent Documents 1 and 2 disclose adhesive films used for backgrinding a semiconductor wafer.

In general, an integrated circuit of a semiconductor has been produced as follows: first, a high-purity monocrystalline silicone etc. is sliced into wafers; then, an integrated circuit is formed on one surface (hereinafter, this surface is referred to as the "circuit-forming surface"); after that, the wafer surface which does not have the circuit thereon (hereinafter, this surface is referred to as the "backside") is ground by grinding or polishing, etc. to have a thin thickness of the wafer at about between 50 and 500 μm; finally, the wafer is diced into individual pieces.

PRIOR ART REFERENCE

Patent Document

Patent Document 1: JP-H10-189504A
Patent Document 2: JP-2008-311514A

SUMMARY OF THE INVENTION

Among these steps, in order to prevent damage and contamination of the semiconductor wafer at the time of grinding the backside of a semiconductor wafer, used is a method of pasting an adhesive sheet on the circuit-forming surface of the semiconductor wafer, the sheet having an adhesive layer used for pressure-sensitive bonding and being used for backgrinding.

After the adhesive sheet is pasted on the semiconductor wafer, an adhesive of the sheet increases tight attachment to the semiconductor wafer because wetting spreads over time. Due to this, at the time of peeling the adhesive sheet from the ground semiconductor wafer, the semiconductor wafer used to be damaged. This phenomenon is likely to occur for a thinner semiconductor wafer.

The present invention provides an adhesive sheet including a substrate and an adhesive layer disposed on the substrate, wherein the substrate is formed of an ethylene/vinyl acetate copolymer having a vinyl acetate content of 10% by mass or less; the adhesive layer contains 100 parts by mass of a (meth)acrylate ester copolymer, 1 to 10 parts by mass of a cross-linker, and 0.05 to 5 parts by mass of a silicone compound; and the (meth)acrylate ester copolymer is a copolymer produced by polymerizing a (meth)acrylate ester monomer and a functional-group-containing monomer.

Implementation of backgrinding a semiconductor wafer by using this adhesive sheet achieves the following advantages: (1) infiltration of washing water into the circuit-forming surface of the semiconductor wafer having the adhesive sheet pasted thereon is less likely to occur; (2) the surface of the ground semiconductor wafer has a small variation in its thickness; (3) the adhesive strength has a small increase rate over time; and (4) after peeling of the adhesive sheet, the circuit-forming surface of the semiconductor wafer has a little residual glue. Due to these advantages, even if the thickness of the ground semiconductor wafer is thin, damage on the semiconductor wafer is less likely to occur at the time of peeling of the adhesive sheet, and contamination is not readily caused on the circuit-forming surface of the semiconductor wafer.

The functional-group-containing monomer preferably has one or both of a hydroxyl group and a carboxyl group.

The cross-linker is preferably an isocyanate compound. The silicone compound preferably has a structure represented by a chemical formula (I):
wherein R and R' each represent alkyl having a carbon number of 1 to 6; X represents epoxy, carboxyl, hydroxyl, carbinol, amino, (meth)acryl, or vinyl; Y is any unit of polyether, alkyl, and aralkyl; a total number of subscripts k, I, m, and n is an integer of 1 to 80; an order of each monomer unit containing the subscript k, I, m, or n in the silicone compound is not limited to an order designated in chemical formula (I).

Another aspect of the present invention resides in a method of backgrinding a semiconductor wafer, the method including: pasting the above adhesive sheet on a circuit-forming surface of a semiconductor wafer, and thereafter; backgrinding the semiconductor wafer; and peeling the adhesive sheet after the backgrinding.

An adhesive sheet and a method of grinding a semiconductor wafer according to the present invention can achieve that even if the thickness of the ground semiconductor wafer is thin, damage on the semiconductor wafer is less likely to occur at the time of peeling of the adhesive sheet, and contamination is not readily caused on the circuit-forming surface of the semiconductor wafer.

DETAILED DESCRIPTION OF THE EMBODIMENTS

The term "monomer unit" herein means a structural unit derived from a monomer. The terms "parts" and "%" herein refer to a mass standard unless otherwise described. The term "(meth)acrylate" herein refers to a generic term including acrylate and methacrylate. In a similar manner, a compound containing a "(meth)" portion such as (meth)acrylate is represented by the generic term referring to a compound including the (meth) portion and a compound not including the (meth) portion.

<1. Adhesive Sheet>

An adhesive sheet of an embodiment of the present invention includes a substrate and an adhesive layer disposed on the substrate, wherein the substrate is formed of an ethylene/vinyl acetate copolymer having a vinyl acetate content of 10% by mass or less; the adhesive layer contains 100 parts by mass of a (meth)acrylate ester copolymer, 1 to 10 parts by mass of a cross-linker, and 0.05 to 5 parts by mass of a silicone compound; and the (meth)acrylate ester copolymer is a copolymer produced by polymerizing a (meth)acrylate ester monomer and a functional-group-containing monomer.

Hereinafter, respective constituents of an adhesive sheet of this embodiment are described in detail.

<1-1. Substrate>

A substrate of this embodiment is made of an ethylene/vinyl acetate copolymer. Examples of the shape include film-like and sheet-like shapes. The vinyl acetate content of the substrate should be 10% by mass or less. This is because when the vinyl acetate content of the substrate is more than 10% by mass, the wafer grinding efficiency decreases. The vinyl acetate content is more preferably 8% by mass or less. When the vinyl acetate content is too small, the substrate may not sufficiently conform to the roughness formed on the semiconductor wafer surface. Thus, the content is preferably 1% by mass or more, more preferably 3% by mass or more, and still more preferably 5% by mass or more.

The thickness of the substrate is preferably between 30 and 300 μm and more preferably between 50 and 250 μm.

<1-2. Adhesive Layer>

An adhesive layer of this embodiment contains 100 parts by mass of a (meth)acrylate ester copolymer, 1 to 10 parts by mass of a cross-linker, and 0.05 to 5 parts by mass of a silicone compound. Another material can be added to an adhesive forming this adhesive layer to an extent which does not inhibit an advantageous effect of the present invention. Examples of another material include a tackifier and a plasticizer.

((Meth)Acrylate Ester Copolymer)

A (meth)acrylate ester copolymer of this embodiment is a copolymer produced by polymerizing a (meth)acrylate ester monomer and a functional-group-containing monomer. The (meth)acrylate ester copolymer may have a monomer unit derived from a vinyl compound other than the (meth)acrylate ester monomer.

The (meth)acrylate ester copolymer has a weight average molecular weight (Mw) of, for example, between 200 thousand and 2.5 million. Specifically, this weight average molecular weight may, for example, be 200 thousand, 400 thousand, 600 thousand, 800 thousand, 1 million, 1.5 million, 2 million, or 2.5 million. The weight may be within a range between any two values exemplified herein.

A ratio of a mass of the functional-group-containing monomer unit to a total mass of the (meth)acrylate ester copolymer is, for example, between 2 and 20% by mass. Specifically, this ratio may, for example, be 2, 4, 6, 8, 12, 14, 16, 18, or 20% by mass. The ratio may be within a range between any two numerical values exemplified herein.

A ratio of a mass of the vinyl compound other than the acrylate ester monomer to a total mass of the (meth)acrylate ester copolymer is, for example, between 0 and 10% by mass. Specifically, this ratio may, for example, be 0, 0.1, 0.5, 1, 2, 3, 4, 5, 6, 7, 8, 9, or 10% by mass. The ratio may be within a range between any two numerical values exemplified herein.

Examples of the (meth)acrylate ester monomer include butyl (meth)acrylate, 2-butyl (meth)acrylate, t-butyl (meth)acrylate, pentyl (meth)acrylate, octyl (meth)acrylate, 2-ethylhexyl (meth)acrylate, nonyl (meth)acrylate, decyl (meth)acrylate, lauryl (meth)acrylate, methyl (meth)acrylate, ethyl (meth)acrylate, isopropyl (meth)acrylate, tridecyl (meth)acrylate, myristyl (meth)acrylate, cetyl (meth)acrylate, stearyl (meth)acrylate, cyclohexyl (meth)acrylate, isobornyl (meth)acrylate, dicyclopentanyl (meth)acrylate, benzyl (meth)acrylate, methoxyethyl (meth)acrylate, ethoxyethyl (meth)acrylate, butoxymethyl (meth)acrylate, and ethoxy-n-propyl (meth)acrylate. The (meth)acrylate ester monomer which is used for production of a (meth)acrylate ester copolymer may have one or two or more types.

Examples of a functional group of the functional-group-containing monomer include hydroxyl, carboxyl, epoxy, amide, amino, methylol, sulfonate, sulfamate, and (phophite)phosphoester. A functional-group-containing monomer having one or more functional groups thereof is present as the above functional-group-containing monomer. In addition, the functional-group-containing monomer has preferably one or both of a hydroxyl group and a carboxyl group. More preferably, the functional-group-containing monomer is (meth)acrylate having a hydroxyl group.

Examples of the functional-group-containing monomer specifically include the following.

Examples of the functional-group-containing monomer having a hydroxyl group include 2-hydroxyethyl (meth)acrylate, 2-hydroxypropyl (meth)acrylate, 2-hydroxybutyl (meth)acrylate and 2-hydroxyvinyl ether. Examples of the functional-group-containing monomer having a carboxyl group include (meth)acrylic acid, crotonic acid, maleic acid, maleic anhydride, itaconic acid, fumaric acid, acrylamide N-glycolic acid and cinnamic acid.

Examples of the functional-group-containing monomer having an epoxy group include glycidyl (meth)acrylate. Examples of the functional-group-containing monomer having an amide group include (meth)acrylamide. Examples of the functional-group-containing monomer having an amino group include N,N-dimethylaminoethyl (meth)acrylate and N-t-butylaminoethyl (meth)acrylate. Examples of the functional-group-containing monomer having a methylol group include N-methylol (meth)acrylamide.

Examples of the functional-group-containing monomer having a sulfonate group include (meth)acryl sulfonate, (meth)allyl sulfonate, vinyl benzyl sulfonate, styrene sulfonate, 2-(meth)acryloyl ethane sulfonate, 2-(meth)acryloyl propane sulfonate, (meth)acryloyl oxymethyl sulfonate, (meth)acryloyl oxyethyl sulfonate, (meth)acryloyl oxypropyl sulfonate, 3-(meth)acryloyloxy-2-hydroxypropyl sulfonate, 2-(meth)acrylamide-2-methylethane sulfonate, 2-(meth)acrylamide-2-methylpropane sulfonate, and 2-(meth)acrylamide-2-methylbutane sulfonate.

Examples of the functional-group-containing monomer having a sulfamate group include hydroxyethyl-N-[2-acryloyl oxyethyl]sulfamate, N,N-bis[2-acryloyl oxyethyl]sulfamate, an addition compound of acryloyl isocyanate and N,N-di(2-hydroxyethyl)sulfamate, hydroxyethyl-N-[2-methacryloyl oxyethyl]sulfamate, N,N-bis[2-methacryloyl oxyethyl]sulfamate, and an addition compound of methacryloyl isocyanate and N,N-di(2-hydroxyethyl)sulfamate.

Examples of the functional-group-containing monomer having a (phosphite)phosphoester group include acid phosphoxyethyl (meth)acrylate, acid phosphoxypropyl (meth)acrylate, 3-chloro-2-acid phosphoxypropyl (meth)acrylate, acid phosphoxy polyoxy ethylene glycol mono(meth)acrylate, and acid phosphoxy polyoxy propylene glycol mono (meth)acrylate.

As described above, the (meth)acrylate ester copolymer may have a monomer unit derived from a vinyl compound other than the (meth)acrylate ester monomer. A monomer having such a monomer unit is hereinafter referred to as the "vinyl compound monomer".

The vinyl compound monomer can preferably employ those having one or more functional groups selected from the group consisting of hydroxyl, carboxyl, epoxy, amide, amino, methylol, sulfonate, sulfamate, and (phosphite)phosphoester.

The vinyl compound monomer having a hydroxyl group may, for example, be vinyl alcohol. Examples of the vinyl compound monomer having a carboxyl group include (meth)acrylic acid, crotonic acid, maleic acid, maleic anhydride, itaconic acid, fumaric acid, acrylamide-N-glycolic acid, and cinnamic acid. The vinyl compound monomer having an epoxy group may, for example, be allyl glycidyl ether or (meth)acrylate glycidyl ether. The vinyl compound monomer having an amide group may, for example, be (meth)acrylamide. The vinyl compound monomer having an amino group may, for example, be N,N-dimethylaminoethyl (meth)acrylate. The vinyl compound monomer having a methylol group may, for example, be N-methylol acrylamide.

(Cross-Linker)

The cross-linker used for this embodiment may be any cross-linker capable of reacting with a functional group of a copolymerized functional-group-containing monomer. Examples of the cross-linker include an isocyanate compound, an epoxy compound, an imine compound, an amino compound, a halide, an amine compound, and carboxylic acid. The isocyanate compound is preferable.

The isocyanate compound as a cross-linker may be a compound having a plurality of isocyanate groups. Examples of the compound having a plurality of isocyanate groups include aromatic isocyanate, alicyclic isocyanate and aliphatic isocyanate. Examples of the aromatic diisocyanate include tolylene diisocyanate, 4,4-diphenylmethane diisocyanate, and xylylene diisocyanate. Examples of the alicyclic diisocyanate include isophorone diisocyanate and methylene bis (4-cyclohexyl isocyanate). Examples of the aliphatic diisocyanate include hexamethylene diisocyanate and trimethyl hexamethylene diisocyanate. These isocyanate compounds may be a dimer or a trimer, and may be an adduct body as obtained by reacting them with a polyol compound. Examples of the adduct body include an adduct body of 2,4-tolylene diisocyanate and trimethylol propane, an adduct body of 2,6-tolylene diisocyanate and trimethylol propane, an adduct body of hexamethylene diisocyanate and trimethylol propane, and an adduct body of isophorone diisocyanate and trimethylol propane.

Examples of the epoxy compound as a cross-linker can include a bisphenol A epoxy compound, a bisphenol F epoxy compound, N,N-glycidyl aniline, N,N-glycidyl toluidine, m-N.N-glycidyl aminophenyl glycidyl ether, p-N.N-glycidyl aminophenyl glycidyl ether, triglycidyl isocyanurate. N.N.N'.N'-tetraglycidyl diamino diphenyl methane, N.N.N'.N'-tetraglycidyl m-xylylene diamine, N.N.N'N'.N''-pentaglycidyl diethylene triamine, and the like.

Examples of the imine compound as a cross-linker include N,N'-diphenyl methane-4,4'-bis(1-aziridine carboxyamide), trimethylol propane-tri-β-aziridinyl propionate, tetramethylol methane-tri-β-aziridinyl propionate, and N,N'-toluene-2,4-bis-(1-aziridine carboxyamide)triethylene melamine.

These cross-linkers may be solely used, or two or more of the cross-linkers may be combined and used.

The formulation amount of the cross-linker may be within a range between 1 and 10 parts by mass per 100 parts by mass of the (meth)acrylate ester copolymer. When the formulation amount is less than 1 part by mass, poor peeling of an adhesive tape due to residual glue or temporal factors occurs. When the amount exceeds 10 parts by mass, the adhesive strength becomes low. This results in occurrence of infiltration of cooling water or cutting waste into a space between the wafer surface and the adhesive sheet during backgrinding of the wafer. Therefore, the amount should be within the foregoing range.

(Silicone Compound)

The silicone compound used in this embodiment is a compound having siloxane linkages (—SiO—) in its backbone. Examples include oil or resin having a siloxane linkage. The silicone compound preferably possesses a structure represented by chemical formula (I):

taining the subscript k, I, m, or n is not limited to an order designated in chemical formula (I).

In chemical formula (I), X is particularly preferably a functional group having any one of epoxy, amino, (meth) acryl, and carboxyl.

The formulation amount of the silicone compound is within a range between 0.05 and 5 parts by mass per 100 parts by mass of the (meth)acrylate ester copolymer, and preferably a range between 0.1 and 4 parts by mass. When the formulation amount is less than 0.05 part, wetting of the adhesive sheet pasted on a wafer spreads over time, thereby increasing tight attachment to a semiconductor member. Accordingly, this results in an increase in the adhesive strength at the time of peeling the adhesive sheet from the wafer. Furthermore, in the case of using a thin wafer, in particular, the wafer damage occurs. When the formulation amount exceeds 5 parts by mass, the cohesion power decreases. Therefore, an excellent stable adhesive strength of the present invention fails to be exhibited.

(Adhesive Layer Thickness)

The thickness of the adhesive layer is preferably between 1 and 100 μm and more preferably between 5 and 60 μm. When the adhesive layer is thin, the adhesive strength may be lowered. Also, water infiltration may be generated during wafer backgrinding. When the adhesive layer is thick, the adhesive strength may be elevated, so that residual glue or poor peeling may occur.

<2. Process for Producing Adhesive Sheet>

Examples of a process for producing an adhesive sheet include a process for producing an adhesive sheet by laminating an adhesive layer on a substrate, a process by coating an adhesive, and a process by printing an adhesive. Examples of a process by coating an adhesive include a process by coating an adhesive directly or indirectly on a substrate by using a coater such as a gravure coater, a comma coater, a bar coater, a knife coater, a die coater, or a roll coater. Examples of a process by printing include relief printing, intaglio printing, planography, flexography, offset printing and screen printing. In addition, the adhesive sheet may be produced by coating the adhesive on a peeling film and by drying the film, followed by transferring and laminating the film on the substrate. For production of the adhesive sheet, the peeling film can be appropriately used.

<3. Method of Backgrinding Semiconductor Wafer>

A method of backgrinding a semiconductor wafer according to this embodiment includes: a pasting step of pasting the above-described adhesive sheet on a circuit-forming surface of a semiconductor wafer; a grinding step of backgrinding the semiconductor wafer after the pasting step; and a peeling step of peeling the adhesive sheet after the grinding step.

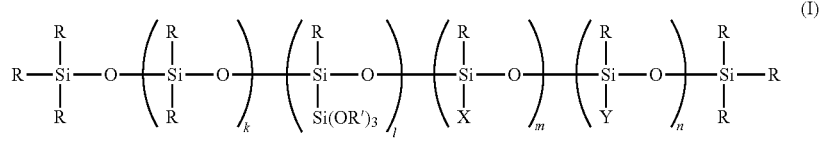

(I)

In the formula, R and R' represent alkyl having a carbon number of 1 to 6, and X represents any one of epoxy, carboxyl, hydroxyl, carbinol, amino, (meth)acryl, and vinyl. Y is any one unit of polyether, alkyl, and aralkyl. A total number of subscripts k, I, m, and n is an integer of between 1 and 80. In the silicone compound, an order of each monomer unit con- Implementation of backgrinding a semiconductor wafer by using the above-described adhesive sheet achieves the following advantages: (1) Infiltration of washing water into a circuit-forming surface of a semiconductor wafer having an adhesive sheet pasted thereon is less likely to occur; (2) the surface of the ground semiconductor wafer has a small variation in its thickness; (3) the adhesive strength has a small increase rate over time; and (4) after peeling of the adhesive sheet, the circuit-forming surface of the semiconductor wafer has a small amount of residual glue. Due to these advantages, even if the thickness of the ground semiconductor wafer is thin, damage on the semiconductor wafer is less likely to occur at the time of peeling of the adhesive sheet, and contamination is not readily caused on the circuit-forming surface of the semiconductor wafer.

EXAMPLES

Examples of an adhesive sheet and a method of backgrinding a semiconductor wafer according to the present invention are described in detail.

Adhesive sheets of Examples and Comparative Examples were manufactured using the following formulations. Table 1 shows main formulations and results of experimental examples.

(2) Cross-Linker (a Curing Agent)
An adduct body of 2,4-tolylene diisocyanate and trimethylol propane.
(3) Silicone Compound
S1: an epoxy-containing silicone compound
S2: a carboxyl-containing silicone compound
S3: a carbinol-containing silicone compound
S4: a silicone oil An adhesive of Example 1 was a mixture containing 100 parts by mass of a (meth)acrylate ester copolymer component, 3.5 parts by mass of a cross-linker (a curing agent), and 2 parts by mass of a silicone compound (S1). With regard to the formulation of other adhesives, the adhesives were prepared by using a formulation in the same manner as in Example 1 except the points indicated in Table 1.
(Preparation of Adhesive Sheet)
The above-described adhesive was applied on a peeling film made of polyethylene terephthalate, and the adhesive was spread so as to obtain an adhesive layer having a thick-

TABLE 1

|  |  | Examples |  |  |  |  |  |  |  |  |  |
|---|---|---|---|---|---|---|---|---|---|---|---|
|  |  | 1 | 2 | 3 | 4 | 5 | 6 | 7 | 8 | 9 | 10 |
| Substrate | Vinyl Acetate Content (%) | 5 | 1 | 9 | 5 | 5 | 5 | 5 | 5 | 5 | 5 |
| Adhesive | (Meth)acrylate Ester Copolymer (parts by mass) | 100 | 100 | 100 | 100 | 100 | 100 | 100 | 100 | 100 | 100 |
|  | Cross-linker (Curing Agent)(parts by mass) | 3.5 | 3.5 | 3.5 | 3 | 1.5 | 8 | 3 | 3 | 3.5 | 3.5 |
|  | Silicone Compound (parts by mass) S1 | 2 | 2 | 2 | 2 | 2 | 2 | 0.1 | 4 | 2 |  |
|  | S2 |  |  |  |  |  |  |  |  |  | 2 |
|  | S3 |  |  |  |  |  |  |  |  |  |  |
|  | S4 |  |  |  |  |  |  |  |  |  |  |
| Evaluation | Water Infiltration | A | A | A | A | A | A | A | A | A | A |
|  | Grinding Efficiency | A | A | B | A | A | A | A | A | A | A |
|  | Time-course Change in Adhesive Strength | A | A | A | A | A | A | A | A | A | A |
|  | Residual Glue | A | A | A | A | A | A | A | A | A | A |

|  |  | Examples |  | Comparative Examples |  |  |  |  |
|---|---|---|---|---|---|---|---|---|
|  |  | 11 | 12 | 1 | 2 | 3 | 4 | 5 |
| Substrate | Vinyl Acetate Content (%) | 5 | 5 | 12 | 5 | 5 | 5 | 5 |
| Adhesive | (Meth)acrylate Ester Copolymer (parts by mass) | 100 | 100 | 100 | 100 | 100 | 100 | 100 |
|  | Cross-linker (Curing Agent)(parts by mass) | 3.5 | 3.5 | 3.5 | 0.5 | 12 | 3 | 3 |
|  | Silicone Compound (parts by mass) S1 |  |  | 2 | 2 | 2 | 0.01 | 7 |
|  | S2 |  |  |  |  |  |  |  |
|  | S3 | 2 |  |  |  |  |  |  |
|  | S4 |  | 2 |  |  |  |  |  |
| Evaluation | Water Infiltration | A | B | A | A | D | A | A |
|  | Grinding Efficiency | A | A | D | A | A | A | D |
|  | Time-course Change in Adhesive Strength | A | A | A | D | A | D | C |
|  | Residual Glue | A | B | A | D | A | A | A |

A: Excellent, B: Good, C: Acceptable, D: Not Acceptable

<Substrate>
An ethylene/vinyl acetate copolymer; the thickness of 120 μm; the vinyl acetate content:1%, 5%, 9%, or 12%.
<Adhesive Layer>
(1) (Meth)Acrylate Ester Copolymer
The copolymer was a copolymer containing 80% by mass of butyl acrylate, 11% by mass of methyl methacrylate, 8% by mass of 2-hydroxyethyl methacrylate, and 1% by mass of acrylic acid. The weight average molecular weight was 720 thousand.

ness of 40 μm after drying. After that, the obtained sheet was laminated with a substrate having a thickness of 120 μm, to obtain an adhesive sheet.
(Evaluation)
[Procedure for Evaluating Water Infiltration]
An adhesive sheet of Examples and Comparative Examples was pasted on a silicon wafer having a diameter of 6 inch and a thickness of 625 μm. The silicon wafer was subjected to backgrinding by using a grinding apparatus while spraying water to yield a thickness of 150 μm.

DFG-850, manufactured by DISCO Corporation, was used as the grinding apparatus. Grinding wheels employed the first wheel of GF01-SD360-VS-100 and the second wheel of GF01-SD2000-BK09-100, both of which were manufactured by DISCO Corporation. Grinding tests were carried out by using the following conditions.

The first wheel: the table rotation speed: 200 rpm, the wheel rotation speed: 4800 rpm, the feed rate: 8 μm/sec.

The second wheel: the table rotation speed: 300 rpm, the wheel rotation speed: 4500 rpm, the feed rate: 0.8 μm/sec.

The cutting water temperature: 25° C.

The cutting water (cooling water) amount: 2.5 L/min

[Criteria for Water Infiltration]

Whether or not the wafer after the grinding had water infiltration (infiltration of water into the surface having the adhesive sheet pasted thereon) was observed.

Excellent: no occurrence of water infiltration.

Good: there is occurrence of water infiltration. However, the water was present within 1 mm from the flat peripheral edge of the wafer.

Not Acceptable: there is occurrence of water infiltration present in a portion inwardly exceeding 1 mm from the flat peripheral edge of the wafer.

[Procedure for Evaluating Grinding Efficiency]

The thickness variation of the surface of the ground wafer was determined using ultra-gauge model 9500A, a wafer-flatness-measuring device manufactured by ADE Corp.

[Criteria for Grinding Efficiency]

Judgments were executed in accordance with a value (i.e., TTV: Total Thickness Variation) for the difference between the maximum value and the minimum value for the thickness of the wafer surface which had been assessed by the above procedure.

Excellent: the TTV was 3 μm or less.

Good: the TTV was more than 3 μm and 4.5 μm or less.

Not Acceptable: the TTV was larger than 4.5 μm.

[Procedure for Estimating Time-Course Change in Adhesive Strength]

An adhesive sheet was pasted on the mirror surface of a silicon wafer, and was subjected to pressure bonding by using a roller back and forth once at 2 Kg. After left for 20 minutes, the adhesive strength was determined under conditions at a peeling angle of 180° and a stretching rate of 300 mm/min. Further, after subjected to pressure bonding under this condition, a test sample which had been left under pasting for 20 minutes and a test sample which had been left for 7 days were prepared. Next, adhesive strength "A" of the test sample which had been left for 20 minutes and adhesive strength "B" of the test sample which had been left for 7 days were each determined. Then, an increase rate was estimated which was calculated by the following calculation equation.

Increase rate=$(100 \times (B-A))/A$

[Criteria for Time-Course Change in Adhesive Strength]

Excellent: the increase rate was less than 5%.

Good: the increase rate was 5% or more and less than 10%.

Not Acceptable: the increase rate was 10% or higher.

[Procedure for Evaluating Residual Glue]

An adhesive sheet was pasted on a particle controlled wafer at a size of 5 inch, and was left for 20 minutes. Then, residues which were attached to the wafer surface following removal of the adhesive sheet were assessed by counting the number of particles having a size of 0.28 μm or larger by using a wafer-surface detection device, WM-7S (manufactured by TOPCON CORPORATION).

[Criteria for Residual Glue]

Excellent: the number of particles was 50 or less.

Good: the number of particles was more than 50 and 100 or less.

Not Acceptable: the number of particles exceeded 100.

[Evaluation Results]

Table 1 shows the evaluation results which were obtained in accordance with the above criteria. As shown in Table 1, when adhesive sheets of Examples 1 to 12 were used and subjected to backgrinding of a semiconductor wafer, better results were obtained in respect to all of the water infiltration, the grinding efficiency, the time-course change in the adhesive strength, and the residual glue. In contrast, when adhesive sheets of Comparative Examples 1 to 5 were used and subjected to backgrinding of a semiconductor wafer, the evaluation results demonstrated that one of the water infiltration, the grinding efficiency, the time-course change in the adhesive strength, and the residual glue was poor as shown in Table 1. Therefore, the adhesive sheets of Comparative Examples 1 to 5 were found unacceptable.

The invention claimed is:

1. A method of backgrinding a semiconductor wafer, the method comprising:
    a pasting step of pasting an adhesive sheet on a circuit-forming surface of a semiconductor wafer;
    a grinding step of backgrinding the semiconductor wafer after the pasting step; and
    a peeling step of peeling the adhesive sheet after the grinding step, wherein
    the adhesive sheet comprises:
    a substrate formed of an ethylene/vinyl acetate copolymer having a vinyl acetate content of 10% by mass or less; and
    an adhesive layer disposed on the substrate, wherein:
        the adhesive layer contains 100 parts by mass of a (meth) acrylate ester copolymer, 1 to 10 parts by mass of a cross-linker, and 0.05 to 5 parts by mass of a silicone compound, and
        the (meth) acrylate ester copolymer is a copolymer produced by polymerizing a (meth) acrylate ester monomer and a functional-group-containing monomer.

2. The method according to claim 1, wherein the functional-group-containing monomer has one or both of a hydroxyl group and a carboxyl group.

3. The method according to claim 2, wherein the cross-linker is an isocyanate compound.

4. The method according to claim 1, wherein the silicone compound has a structure represented by chemical formula (I):

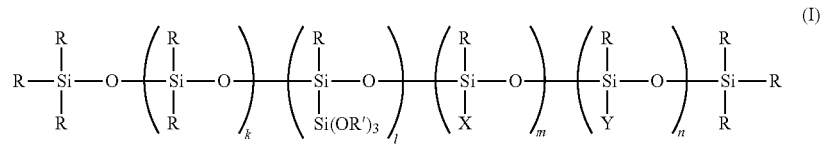

wherein R and R' each represent alkyl having a carbon number of 1 to 6;

X represents epoxy, carboxyl, hydroxyl, carbinol, amino, (meth)acryl, or vinyl;

Y is any unit of polyether, alkyl, and aralkyl;

A total number of subscripts k, I, m, and n is an integer of 1 to 80; and an order of each monomer unit containing the subscript k, I, m, or n is not limited to an order designated in chemical formula (I).

* * * * *